US009396902B2

(12) United States Patent
Biloiu et al.

(10) Patent No.: US 9,396,902 B2
(45) Date of Patent: Jul. 19, 2016

(54) GALLIUM ION SOURCE AND MATERIALS THEREFORE

(75) Inventors: Costel Biloiu, Rockport, MA (US);
Craig R. Chaney, Lanesville, MA (US);
Neil J. Bassom, Hamilton, MA (US);
Benjamin Colombeau, Salem, MA (US); Dennis P. Rodier, Francestown, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/477,253

(22) Filed: May 22, 2012

(65) Prior Publication Data

US 2013/0313971 A1 Nov. 28, 2013

(51) Int. Cl.
*H01J 7/24* (2006.01)
*H01J 27/20* (2006.01)
*H01J 37/02* (2006.01)
*H01J 37/08* (2006.01)

(52) U.S. Cl.
CPC . *H01J 27/20* (2013.01); *H01J 7/24* (2013.01); *H01J 37/02* (2013.01); *H01J 37/08* (2013.01)

(58) Field of Classification Search
CPC ............. H01J 7/24; H01J 37/02; H01J 37/08; H01J 37/3053; H01J 37/3171
USPC ............ 315/111.01–111.91; 250/423 R, 425, 250/427, 492.21, 492.3
See application file for complete search history.

(56) References Cited

U.S. PATENT DOCUMENTS

| 6,661,014 | B2 * | 12/2003 | Reyes | H01J 37/3171 250/423 F |
| 6,744,214 | B2 * | 6/2004 | Horsky | H01J 37/08 250/427 |
| 6,768,121 | B2 * | 7/2004 | Horsky | H01J 27/12 250/427 |
| 9,299,529 | B2 * | 3/2016 | Tanjo | H01J 27/02 |
| 2002/0130270 | A1 | 9/2002 | Reyes | |
| 2002/0179247 | A1 * | 12/2002 | Davis et al. | 156/345.33 |
| 2002/0179248 | A1 * | 12/2002 | Kabansky | 156/345.36 |
| 2003/0000921 | A1 * | 1/2003 | Liang et al. | 216/59 |
| 2006/0163489 | A1 * | 7/2006 | Low | H01J 27/08 250/426 |
| 2010/0087052 | A1 * | 4/2010 | Xu | 438/530 |
| 2012/0024223 | A1 * | 2/2012 | Torres et al. | 117/104 |
| 2012/0058252 | A1 | 3/2012 | Sweeney | |
| 2012/0255490 | A1 * | 10/2012 | Tanjo | 118/638 |

FOREIGN PATENT DOCUMENTS

EP 0066288 A1 12/1982

OTHER PUBLICATIONS

International Search Report and Written Opinion mailed Oct. 14, 2013 for PCT/US2013/039437 dated May 3, 2013.

* cited by examiner

*Primary Examiner* — Tung X Le

(57) ABSTRACT

In one embodiment, a method for generating an ion beam having gallium ions includes providing at least a portion of a gallium compound target in a plasma chamber, the gallium compound target comprising gallium and at least one additional element. The method also includes initiating a plasma in the plasma chamber using at least one gaseous species and providing a source of gaseous etchant species to react with the gallium compound target to form a volatile gallium species.

10 Claims, 5 Drawing Sheets

GALLIUM ION SOURCE AND MATERIALS THEREFORE

FIELD

The present disclosure relates to ion sources and more particularly, to materials systems and apparatuses for producing Gallium (Ga) ions in connection with semiconductor fabrication.

BACKGROUND

Processing techniques such as ion implantation provide the ability to process substrates using a variety of species. In ion implantation systems, a variety of ion sources are available including solid, liquid, and gas-based ion sources. For many ion species, a variety of gaseous precursors are available to serve as a source of the material to be used to process the substrate. However, for some ionic species gaseous precursors do not exist, or those that do exist yield low beam current. For those ionic species lacking an effective gaseous precursor, liquid and/or powder precursors may be available, but such precursors entail the use of a vaporizer in order to produce gas phase species for the ion source from which ions are to be extracted.

An alternative approach to the above precursors is the use of a solid target that can be inserted into an ion source chamber. In such configuration, a plasma may be generated using chosen ion species in the ion source chamber, such as inert gas ions. The solid target may act as a sputtering target for the plasma ions, wherein the plasma ions are accelerated toward the target and sputter atoms or groups of atoms from the target. However, if the target is a dielectric material, a dc bias applied to the target will be ineffective in biasing the target such that the effective potential drop between plasma and target is equivalent to the difference in plasma potential and floating self bias potential that develops on the surface of the dielectric target. This potential, equivalent in volts to the ion energy in eV for singly charged ions, is typically in the range of several volts to several tens of volts, resulting in ions striking the target with energies that may be less than 100 eV. Because the sputter yield for most materials is low in this energy range, it may be desirable to employ an etchant gas in conjunction with the plasma to increase the yield rate of target atoms into the gas phase.

Gallium ions have long been used in focused ion beam processing in which the gallium ions are derived from a liquid source. However, this may not be suitable for systems requiring a high current density over a relatively larger area. In the case of solid targets, a solid Ga target cannot be readily used for an ion source due to the low melting temperature of the elemental metal. In view of the above, it will be apparent that improvements in gallium ion sources are needed.

SUMMARY

In one embodiment, a method for generating a gallium ion beam includes providing a gallium compound target in a plasma chamber, where the gallium compound target comprises gallium and at least one additional element. The method further includes initiating a plasma in the plasma chamber using at least one gaseous species and providing a source of gaseous etchant species operable to react with the gallium compound target to form a volatile gallium species.

In one embodiment, a method for generating an ion beam having gallium ions includes providing at least a portion of a gallium compound target in a plasma chamber, where the gallium compound target comprises gallium and at least one additional element. The method further includes initiating a plasma in the plasma chamber using at least one gaseous species and providing a source of gaseous etchant species to react with the gallium compound target to form a volatile gallium species.

In an additional embodiment, an apparatus for generating a gallium ion beam includes a plasma source to generate a plasma within a plasma chamber, where the plasma has at least one gaseous species. The apparatus also includes a gallium compound target at least partially disposed in the plasma chamber, the gallium compound target having gallium and at least one additional element, wherein one or more of the at least one gaseous species and the gallium compound target interact to generate a gaseous etchant species operable to react with the gallium compound target to form a volatile gallium-containing species.

DETAILED DESCRIPTION

Embodiments disclosed herein provide improved sources for gallium ions. In various embodiments, an improved source may include a novel combination of a solid gallium compound target and ambient gas species for a plasma-based source, such as an indirectly heated cathode (IHC) ion source. The present embodiments may be used, for example, in ion implantation system, including beamline ion implantation systems in which gallium ions are extracted from an ion source and provided toward a target. Particular embodiments are directed to a target/gas combination for use in an indirectly heated cathode source or other plasma-based ion source that employs a solid target.

Figure 1:
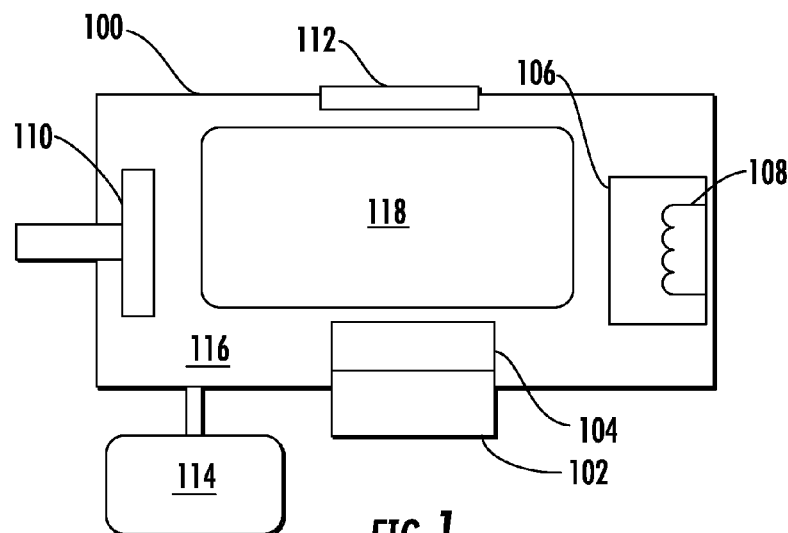
FIG. 1 depicts an embodiment of an ion source.

Although Ga ions have been employed in focused ion beam technology, development of high current, high throughput Ga ion sources has lagged for the aforementioned reasons. In one example of a high current application, Ga may be used as an acceptor type (p-type) dopant for group IV semiconductors, such as silicon. However, conventional commercial ion implantation systems have focused more on boron as a p-type dopant than Gallium. Development of high current Gallium ion sources may facilitate the use of gallium as a dopant in large substrates such as commercial semiconductor wafer fabrication. In particular, the present embodiments provide solid gallium-based target materials that may be used in conjunction with various etchant gas to produce gallium ions in an ion source adapted to provide ions for ion implantation. FIG. 1 depicts an exemplary ion source 100, which includes a target holder 102, target 104, and cathode 106. In some embodiments, the cathode 106 may be an indirectly heated cathode that is heated by filament 108, as illustrated in FIG. 1. The ion source 100 also includes a repeller 110 and extraction aperture 112.

The operation of ion source 100 may be similar to the operation of conventional IHC ion sources. For example, a bias power supply (not shown) may have a positive terminal connected to cathode 106 and a negative terminal connected to filament 108. The bias power supply causes acceleration of electrons emitted by filament 108 to cathode 106 to produce heating of cathode 106. Alternatively, a filament power supply not shown may heat the filament 108, which, in turn, generates electrons that are accelerated toward the cathode 106 and thereby cause heating. The extraction aperture 112 may include an extraction electrode and a suppression electrode (both not shown) that are aligned with the extraction aperture 112 as is known in the art.

When the ion source 100 is in operation, the filament 108 is heated resistively by a filament current $I_F$ to thermionic emission temperatures which may be on the order of, for example, 2200° C. Electrons emitted by filament 108 are accelerated by a bias voltage $V_B$ between filament 108 and cathode 106 which bombard and heat cathode 106. Electrons emitted by cathode 106 are accelerated by arc voltage that may be applied to the plasma chamber of the ion source 100 and may ionize gas molecules received from gas source 114 within chamber 116, thereby forming plasma 118. Repeller 110 builds up a negative charge as a result of incident electrons and eventually has a sufficient negative charge to repel electrons back through chamber 116 producing additional ionizing collisions.

In order to produce gallium ions for extraction by extraction aperture 112, the target 104 may provide a source of gallium that is conveyed to chamber 116, ionized, and then accelerated through extraction aperture 112. The present inventors have identified a set of criteria and novel combinations of those criteria for developing a gallium compound target/gas species system that may be used for a gallium ion source. Gallium compounds that may be useful as a solid target in an ion source such as an IHC ion source may fulfill one or more desired parameters. For example, the gallium compound used as a target material has a high sputtering rate. A high sputtering rate denotes that gallium-containing material is sputtered (ejected through momentum transfer process) from the surface of the target when subjected to bombardment by ions from the ion source plasma. In this manner, a relatively larger number of gallium ions may be produced for a given density of sputtering ions in a plasma of the ion source.

Another parameter that may be achieved is that the differential sputter yield between gallium and other constituents of the compound target is not large. In many known compound targets, sputtering causes changes in the target composition due to the fact that one component is removed preferentially over another component. This process may result in unstable drift in composition of material being removed and may cause undesirable changes in the target surface. In ion source chambers where maintaining stable target composition is not a concern it may be desirable to yield a higher fraction of gallium from the target than other component(s) of the target, so that ions produced from the sputtered target material contain a greater fraction of gallium.

Another desired parameter is that the gallium compound used for the target has a high melting temperature. A higher melting temperature facilitates use in ion sources, such as IHC sources, in which target heating may be substantial. This precludes the use of low melting point materials such as gallium metal as noted above.

The gaseous gallium-containing species that are produced in the ion source do not form solid byproducts, which may deposit inside the ion source. This may be desirable to avoid unwanted surface deposits within the source. Another parameter that may be considered is that the gallium compound material may be susceptible to chemical etching by one or more species provided from a plasma.

Figure 2:
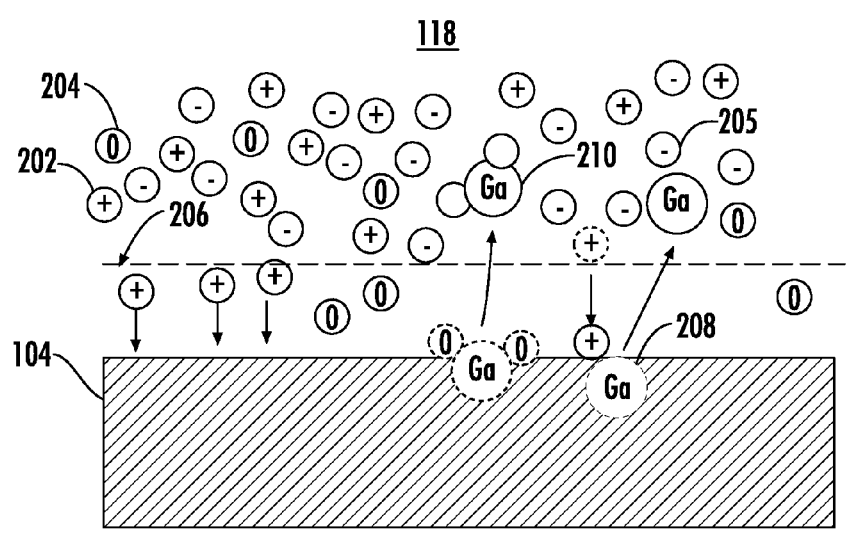
FIG. 2 depicts a scenario for generating gallium ions consistent with the present embodiments.

FIG. 2 depicts an exemplary process for producing Ga ions from the gallium compound target 104, consistent with the present embodiments. In the illustrated embodiment, a plasma 118 includes (positively charged) ions 202, as well as neutral species 204, and electrons 205 (negatively charged). When the ions reach a plasma sheath boundary 206, the ions may accelerate across the sheath and strike the target 104 with an energy equivalent to the potential drop between the plasma and target. For an insulating target, this potential drop in an IHC plasma source may typically be several volts up to tens of volts. Accordingly, the ions 202 may strike the target 104 with an energy typically less than about 100 eV. In this ion energy range, the sputter yield is typically significantly lower than the maximum sputter yield available for most materials which typically may occur at ion energies in the 1,000V to 10,000V range. Thus, the number of gallium atoms 208 removed from the target 104 by sputtering may be relatively low for each ion 202 incident on the target. Accordingly, it may be useful to provide an additional source to remove gallium from the target 104.

In some embodiments, the additional source for removal of gallium may take the form of gaseous etchant species operable to react with the gallium compound target to form a volatile gallium species. In other words, the volatile gallium species may be a gallium-containing species that dissociates from the target surface 104 to form a gaseous molecule which may enter plasma 118. The gaseous etchant species may be ions, neutrals, or both. As illustrated in FIG. 2, for example, neutral species 204 may react with gallium atom 208 at the surface of target 104 to form a gallium-containing gaseous species 210. In one example, the volatile gallium species, that is, the gallium-containing species 210, may be $GaF_2$, which may be formed by reaction of the gallium at the surface of target 104 with a fluorine-containing species, as discussed below. In various embodiments, as detailed below, the source of the gaseous etchant species may be a gas supplied to the ion source chamber and/or may be a component of the gallium compound target itself. Various gallium compounds have been studied by the present inventors, which led to the discovery of novel materials systems for high current gallium ion sources as described in more detail below.

Figure 3:
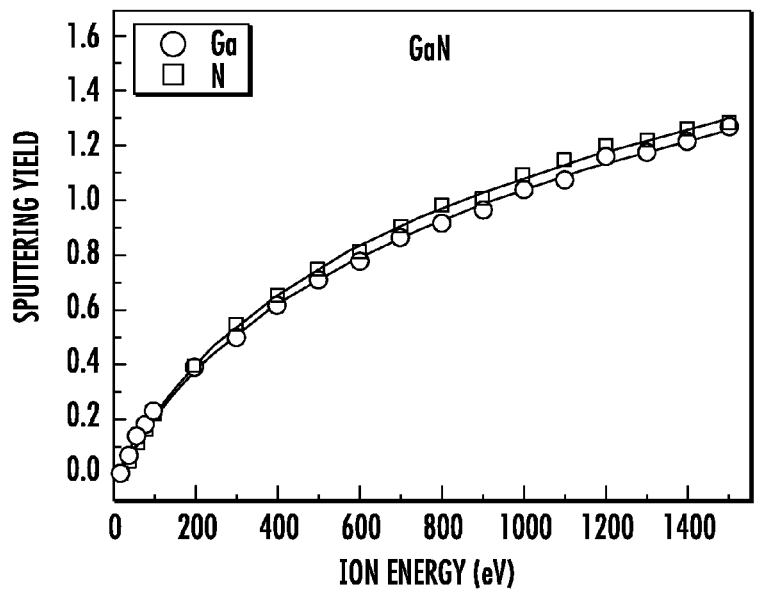
FIG. 3 depicts sputter yield curves for gallium nitride.

FIG. 3 depicts an exemplary simulated sputter yield of GaN, which exhibits a high melting temperature in excess of 2000° C., and is therefore a potential candidate for use in an IHC source. As illustrated, GaN exhibits a relatively high average sputter yield on the order of approximately 1 at 1000 eV and has an appreciable sputter yield of about 0.2 even at 100 eV. Moreover, the relative sputter yield is between N and Ga is about equal, indicating that a GaN target may be relatively stable in a plasma sputtering configuration.

Figure 4:
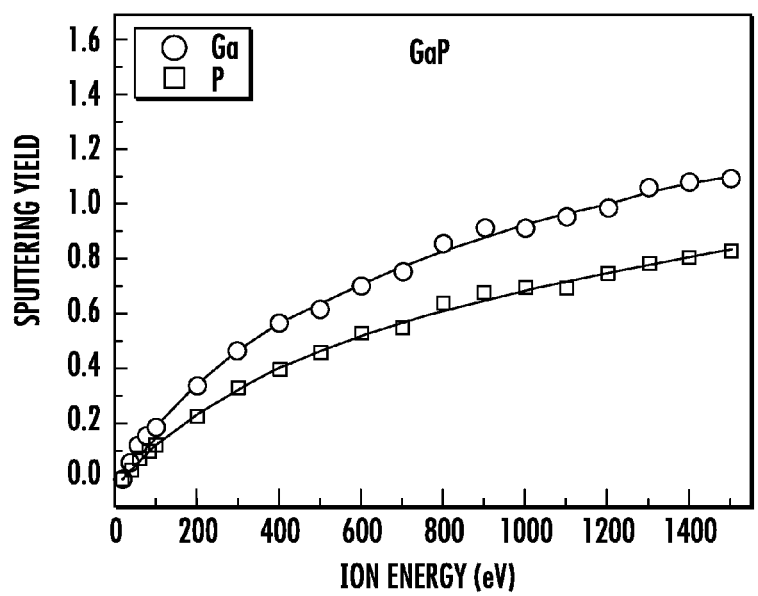
FIG. 4 depicts sputter yield curves for gallium phosphide.

FIG. 4 depicts an exemplary simulated sputter yield of GaP, which exhibits a relatively high sputter yield, and only a relatively small differential sputter yield in which gallium is preferentially sputtered. For example, GaP exhibits a sputtering yield of approximately 1 at about 1100 eV. However, GaP is known to dissociate at about 900° C. In addition, GaP has been observed to deposit unwanted phosphorous material inside a plasma chamber used to sputter the GaP.

Figure 5:
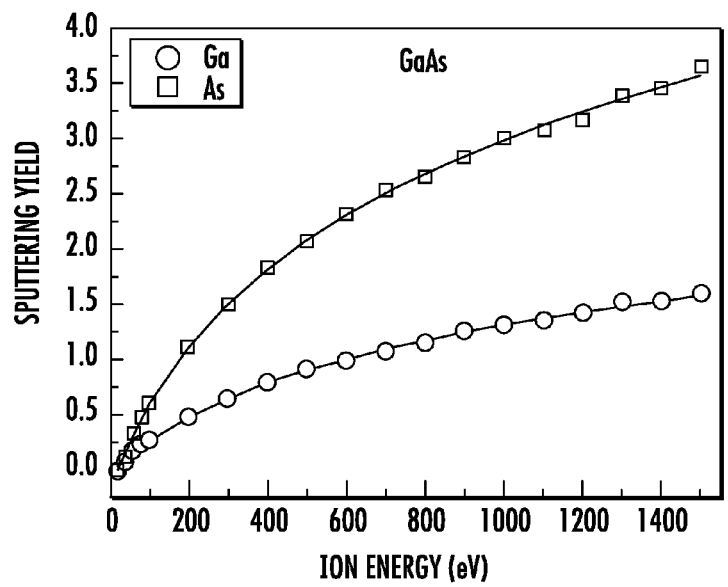
FIG. 5 depicts sputter yield curves for gallium arsenide.

FIG. 5 depicts an exemplary simulated sputter yield of GaAs, which exhibits a high melting temperature of about 1238° C. and is therefore also a potential candidate for use in an IHC source. The sputter yield of each of the GaAs constituents is also relatively robust as compared to, for example, GaP.

Figure 6:
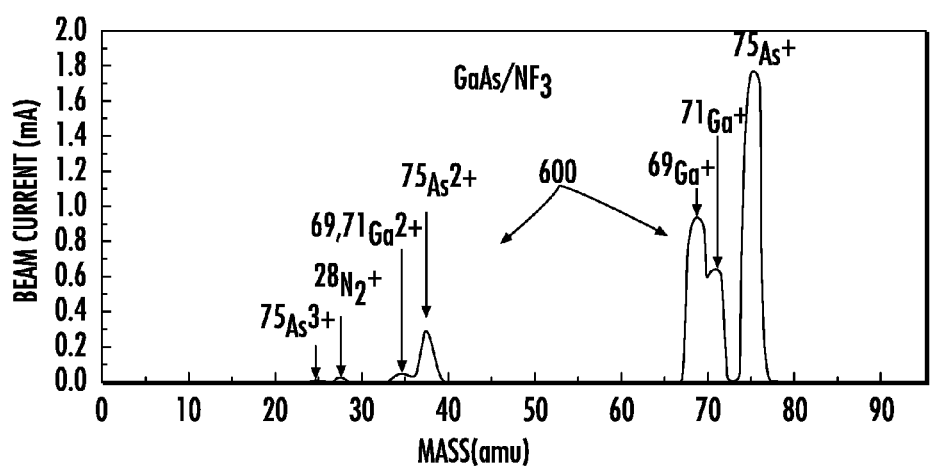
FIG. 6 depicts ion species produced by a gallium nitride target subject to a plasma.

In particular, FIG. 6 depicts results of mass spectroscopic measurement of an ion beam extracted from an ion source containing a solid GaAs target. This phenomenon was investigated by measuring ions extracted from an ion source that employs a GaAs target. The plasma used in conjunction with the GaAs target included $NF_3$ gas. The mass spectrum 600 includes multiple peaks representing different Ga and As species, including $^{69}Ga^+$, $^{71}Ga^+$, $^{69}Ga^{2+}$, $^{71}Ga^{2+}$, $^{69}Ga^{+75}As^+$, $^{75}As^{2+}$, and $^{75}As^{3+}$. As is evident from the mass spectrum 600, the relative abundance of As is significantly greater than gallium.

Figure 7:
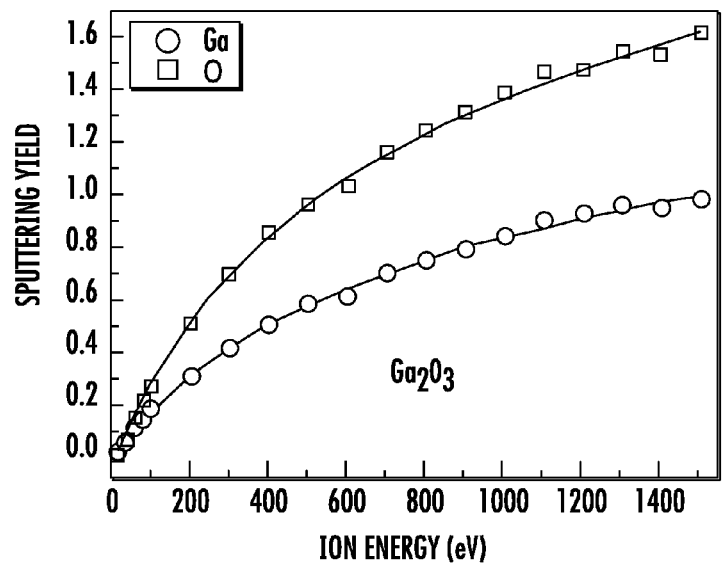
FIG. 7 depicts sputter yield curves for gallium oxide.

Other materials, including gallium oxide based targets, have also been investigated. For example, the compound $Ga_2O_3$ has a melting temperature of 1900° C. and thus is well suited for operation in an ion source ambient that generates elevated temperatures, such as in a IHC ion source. In particular, FIG. 7 depicts the results of an exemplary simulation of sputter yield for $Ga_2O_3$ (also referred to hereinafter merely as "gallium oxide"). Although the overall sputter rate of gallium in gallium oxide compound targets is lower than in gallium arsenide, gallium phosphide, and gallium nitride, the gallium oxide material is thermally stable, and does not form solid byproducts that might undesirably deposit in an ion source.

In accordance with various embodiments, novel combinations of gaseous species and gallium compound targets for producing stable, high current gallium ion sources are presented. Although, for operation in a plasma-based ion source, it is desirable for a solid target to generate a high sputter yield of gallium in order to generate enough gallium to provide high gallium ion beam current, other factors may also be considered in creating a high current of gallium ions. For example, species that act as chemical etchants may be effective in reacting with gallium atoms to create volatile gallium-containing gaseous species, as noted previously.

Once a gallium species leaves the surface of the gallium compound target, either via sputtering, or via formation of a volatile gallium-containing gaseous species, the gallium species is subject to ionization in the ion source plasma. Depending on the composition of the plasma constituents, the relative ionization of gallium species over other gas phase species may be promoted. Therefore, in various embodiments, a combination of gallium target and gaseous species are disclosed that produce a combination of sputtering and chemical etching at the gallium compound target in conjunction with selective ionization of gallium species.

Figure 8:
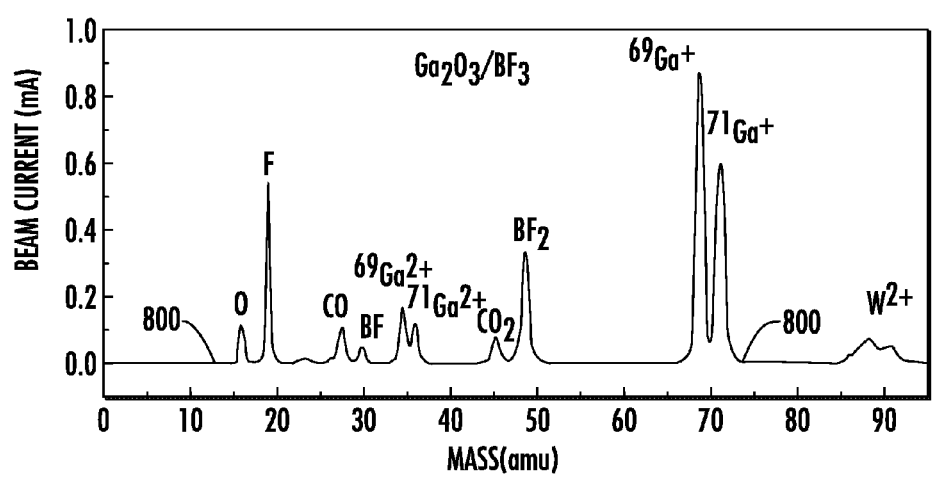
FIG. 8 depicts ion species produced by a gallium oxide target subject to a plasma, consistent with an embodiment.

FIG. 8 presents results of mass spectroscopic measurement of an ion beam extracted from an ion source containing a solid gallium oxide target subjected to a $BF_3$-containing plasma. In this exemplary embodiment, a gallium oxide target is placed in an ion source chamber into which $BF_3$ gas is introduced and a plasma is generated. In addition to providing ions that may sputter gallium atoms from the gallium oxide target, the $BF_3$-containing plasmas provide etchant species derived from the $BF_3$ molecule. These species are operable to etch gallium from the solid gallium oxide target thereby generating enough gallium for a high current of gallium ions. The mass spectrum 800 in FIG. 8 illustrates multiple peaks representing different Ga species including $^{69}Ga^+$, $^{71}Ga^+$, $^{69}Ga^{2+}$, $^{71}Ga^{2+}$, as well as various oxygen-containing species and fluorine-containing species. As is evident, the gallium ion beam current (the sum of the individual gallium ion peaks) is relatively larger than non-gallium ion beam current created by the aforementioned oxygen- or fluorine-containing species. The production of the gallium ions measured in the ion beam may occur in the following manner: some Ga species are sputtered from the solid gallium oxide target and ejected into the ion source plasma, while other Ga species are chemically etched by species derived from the BF3 gas to form gaseous gallium-containing species that enter the ion source plasma. Gallium neutral species in the ion source plasma are ionized by collisions with energetic species that take place therein, and then may be extracted through an extraction system (e.g. extraction aperture 112) to form a gallium ion beam. In particular, $BF_3$ may generate gallium-containing species in the plasma according to the following mechanism. In a first step, the $BF_3$ gaseous species is dissociated in the plasma, which may yield various products including atomic fluorine (F) gas species. The etching of gallium atoms from the gallium oxide target and subsequent generation of gallium ions may then proceed in the following manner:

$$Ga(s)+2F(g) > GaF2(g) \tag{1}$$

$$GaF2(g)+e > GaF(g)+F(g)+e \tag{2}$$

$$GaF(g)+e > Ga(g)+F(g)+e \tag{3}$$

$$Ga(g)+e > Ga++e+e \tag{4}$$

After dissociation of Ga and F in the discharge, two fluorine atoms in the gas phase (g) that are generated from the dissociation process combine with a gallium atom from the solid target (s) to form unstable volatile compound $GaF_2$ (g) according to reaction (1), which enters the gas phase. The $GaF_2$ (g) easily dissociates into Ga (g) and F(g) according to reactions (2) and (3). The Ga (g) species may be present in the plasma and subsequently experience ionization collisions with energetic electrons in the plasma to form Ga+ according to reaction (4).

Although only a relatively small amount of unwanted oxygen ion current is produced using the $Ga_2O_3/BF_3$ system, a larger fraction of fluorine-containing ions from the $BF_3$ are created. Accordingly, the "gallium" ion beam extracted from a $Ga_2O_3/BF_3$ yields a relatively high amount of fluorine-containing ions as a contaminant.

In other embodiments, a gallium oxide target is placed in an ion source chamber (e.g. 116) into which $NF_3$ gas is introduced and a plasma is generated. The use of $NF_3$ gas in conjunction with $Ga_2O_3$ in a plasma ion source has multiple advantages. For example, $NF_3$ readily dissociates into reaction products including fluorine, which can thereby react with the gallium in the gallium oxide target to produce gas phase gallium as shown by reactions (1)-(4) above.

Figure 9:
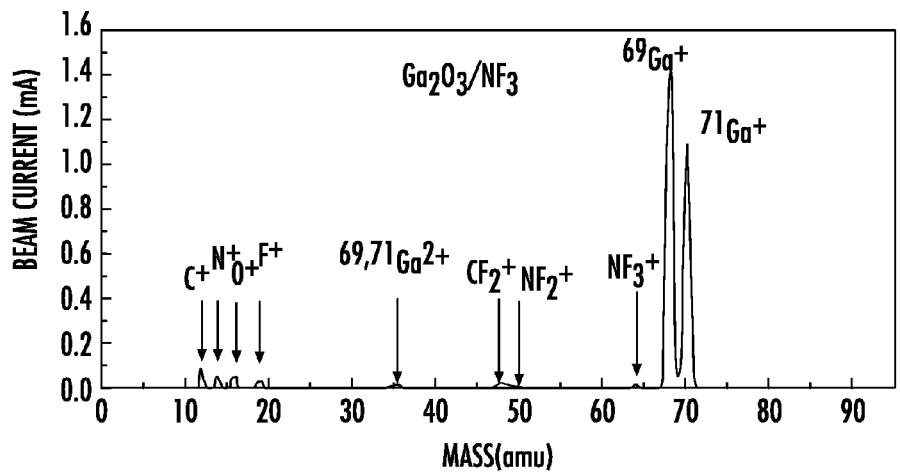
FIG. 9 depicts ion species produced by a gallium oxide target subject to another plasma, consistent with another embodiment.

In addition, as illustrated in FIG. 9, the use of $NF_3$ reduces the relative amount of non-gallium ions formed in a plasma. In particular, FIG. 9 presents results of mass spectroscopic measurement of an ion beam extracted from an ion source containing a solid gallium oxide target subjected to an $NF_3$-containing plasma. In this case, the gallium ion beam current increases by a factor of about 2 as compared to the $BF_3$/gallium oxide system as illustrated in FIG. 8. Moreover, the relative amount of current carried by non-gallium ions is comparatively less. This difference may be explained by the difference in ionization properties in the $BF_3$ plasma as opposed to the $NF_3$ plasma. As illustrated in Table I, the ionization energy of gallium is 5.99 eV which is a relatively low value that indicates that gallium neutrals may readily ionize by collisions with energetic electrons when entering a plasma, as given by reaction (4) above. Unless otherwise noted, the term "ionization energy" as used herein refers to the first ionization energy. In a $BF_3$ plasma, the $BF_3$ molecules may dissociate into $BF_2$, BF, and B, among other species. As illustrated in Table I, each of these dissociation product species has an ionization energy in the range of 8-11 eV, which is somewhat higher than the ionization energy for gallium, but sufficiently close that some dissociation products of $BF_3$ will ionize in a plasma containing gallium ions. In an $NF_3$ plasma, the $NF_3$ molecules may readily dissociate into fluorine and nitrogen species. As further shown in Table I, the ionization potentials of nitrogen and fluorine are, respectively, more than 8 and 11 eV higher than that of Gallium. Thus, in the $NF_3$ plasma, the electron energy distribution is clamped by Ga (5.99 eV ionization potential), thereby making ionization of other species having high ionization potential, such as nitrogen and fluorine, much less probable.

TABLE I

| Specie | $\epsilon_{ioniz}$ (eV) |
|---|---|
| B | 8.29 |
| $BF_2$ | 9.40 |
| BF | 11.12 |
| $BF_3$ | 15.70 |
| F | 17.42 |
| N | 14.57 |
| Ga | 5.99 |

In alternative embodiments, etchant species that are provided for etching the gallium compound target may originate in the gallium compound target itself. For example, a gallium compound target may be fabricated to contain a precursor material to be used as a source of etchant for the gallium. In various examples, a gallium trihalide may be used as a target material. The compounds $GaCl_3$, $GaI_3$ and $GaBr_3$ all have melting temperatures below 250° C., making them unattractive for use in IHC ion sources, where elevated target temperatures are typical. However, the compound $GaF_3$ (also referred to herein as "gallium fluoride") has a melting temperature estimated to be about 1000° C. Accordingly, in some embodiments a $GaF_3$ target may be employed in an ion source, such as an IHC ion source, to create an ion beam containing gallium ions. In particular, a plasma discharge may be initiated using a gas, such as an inert gas. Examples of suitable inert gas include He, Ar, Kr, and Xe and mixtures thereof. Ions from the inert gas plasma may then interact with the $GaF_3$ target to create gaseous etchant species that generate volatile gallium that is released from the $GaF_3$ target. For example, the inert gas ions may sputter material from the $GaF_3$ target, causing the generation of fluorine species including fluorine atoms into the gas phase in the ion source chamber. The fluorine species may subsequently react with gallium in the $GaF_3$ target to cause target etching and release of gallium into the gas phase, as depicted in the reactions (1)-(3). In addition, fluorine ions may be created in the plasma.

After initiation of a plasma in an ion source chamber using an inert gas, such as argon, the flow of inert gas into the ion source chamber may be ramped down and/or terminated as the generation of ionized gaseous fluorine species becomes sufficient to create a self-sustaining plasma in which the source of ions for the plasma is the $GaF_3$ target. In the self-sustaining plasma, the yield rate of fluorine from the target via chemical etching and sputtering is sufficient to generate adequate fluorine ions and reactive species to be used to continue etching of the target. One advantage of the use of a $GaF_3$ target to generate gallium ion beams without a fluoride gas, such as $NF_3$, is that any corrosive effects of the fluoride gases on ion source hardware, such as gas feed lines, is eliminated.

Figure 10:
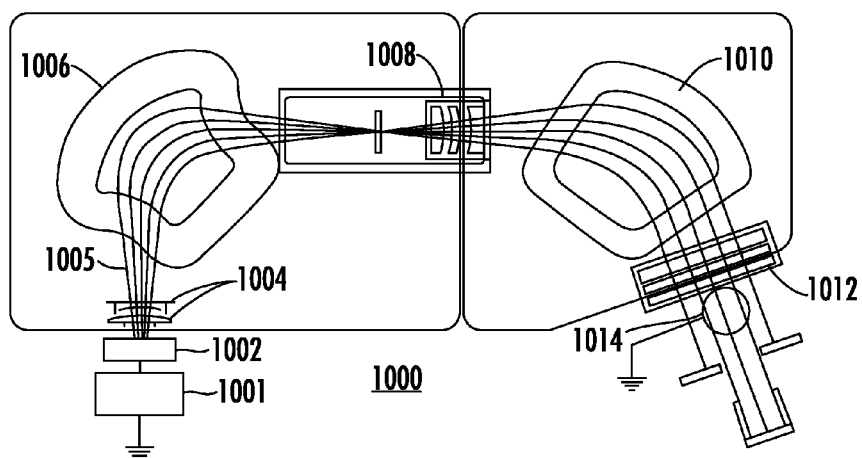
FIG. 10 depicts an exemplary ion implantation system.

As noted, a gallium ion source may be employed in a beam-line ion implantation system (ion implanter). FIG. 10 is a block diagram of such an ion implanter that illustrates general features of ion implanters that may be used in embodiments of the present invention. System 1000 includes an ion source 1002. A power supply 1001 supplies the required energy to ion source 1002, which is configured to generate gallium ions. The generated gallium ions are extracted from the source through a series of electrodes 1004 (extraction electrodes) and formed into a beam 1005, which passes through a mass analyzer magnet 1006. The mass analyzer is configured with a particular magnetic field such that only the ions with a desired mass-to-charge ratio are able to travel through the analyzer. Gallium ions pass through deceleration stage 1008 to corrector magnet 1010. Corrector magnet 1010 is energized to deflect ion beamlets in accordance with the strength and direction of the applied magnetic field to provide a beam targeted toward a work piece or substrate positioned on support (e.g. platen) 1014. In some cases, a second deceleration stage 1012 may be disposed between corrector magnet 1010 and support 1014. The gallium ions lose energy when they collide with electrons and nuclei in the substrate and come to rest at a desired depth within the substrate based on the acceleration energy.

In accordance with embodiments of the present invention, the substrate may be attached to a movable stage configured to provide a set of relative motions with respect to a beam, such as beam 1005. This may include a translational motion, a twist motion, and a tilt motion. The implantation system 1000 includes a tilt stage that provides a substrate tilt with respect to an incident beam, for example, from about −75 to +75 degrees with respect to a normal to the substrate.

Although embodiments detailed above focus on gallium ion beam production for IHC sources to be used in a beam line implantation apparatus, other embodiments extend to solid target gallium ion sources that may employ RF excitation or other source to generate a plasma. Moreover, the ion sources of the present embodiments may be deployed for use in any apparatus or process requiring high gallium ion current.

In addition, the present embodiments include the use of any gas that provides etchants to etch gallium from a solid target and provide components having higher ionization energy than gallium, such as nitrogen and fluorine.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method for generating an ion beam having gallium ions, comprising:
   providing at least a portion of a gallium fluoride target in a plasma chamber;
   initiating a plasma in the plasma chamber using a non-fluorine-containing gas to generate inert gas ions;
   generating, using the inert gas ions, a gaseous etchant to react with the gallium fluoride target to form the gallium ions,
   wherein the generating the gaseous etchant species comprises generating a fluorine-containing etchant species by etching fluorine from the gallium fluoride target; and
   generating a self-sustaining plasma using the fluorine-containing etchant species, wherein after initiation of the plasma a flow of the non-fluorine-containing gas into the plasma chamber is terminated.

2. The method of claim 1 further comprising providing the gallium fluoride target in an indirectly heated cathode source.

3. The method of claim 1, wherein the gallium fluoride target has a melting temperature in excess of 800° C.

4. The method of claim 1, wherein the gaseous etchant species is operable to generate a gas phase species having an ionization energy greater than 8 eV.

5. The method of claim 1, wherein the fluorine-containing etchant species comprises $GaF_2$.

6. An apparatus for generating gallium ions for a gallium ion beam, comprising:
   a plasma source to generate a plasma within a plasma chamber, the plasma comprising inert gas ions formed from a non-fluorine-containing gas; and
   a gallium fluoride target at least partially disposed in the plasma chamber,
   wherein the inert gas ions and the gallium fluoride target interact to generate a gaseous etchant species operable to react with the gallium fluoride target to form the gallium ions,
   wherein the gaseous etchant species is operative to generate ionized gaseous fluorine species in the plasma that originate from the gallium fluoride target, and
   wherein the ionized gaseous fluorine species are operative to generate a self-sustaining plasma, wherein after initiation of the plasma a flow of the inert gas into the plasma chamber is terminated.

7. The apparatus of claim 6, wherein the gallium fluoride target has a melting temperature in excess of 800° C.

8. The apparatus of claim 6, wherein the plasma chamber comprises an indirectly heated cathode.

9. The apparatus of claim 6, wherein the gaseous etchant species is operable to generate a gas phase species having an ionization energy greater than 8 eV.

10. The apparatus of claim 6, wherein the fluorine-containing etchant species comprises $GaF_2$.

* * * * *